United States Patent
Yamazaki et al.

(10) Patent No.: US 8,227,324 B2
(45) Date of Patent: Jul. 24, 2012

(54) METHOD FOR PRODUCING GROUP III NITRIDE-BASED COMPOUND SEMICONDUCTOR CRYSTAL

(75) Inventors: Shiro Yamazaki, Aichi (JP); Makoto Iwai, Nagoya (JP); Takanao Shimodaira, Nagoya (JP); Takatomo Sasaki, Suita (JP); Yusuke Mori, Suita (JP); Fumio Kawamura, Suita (JP)

(73) Assignees: Toyoda Gosei Co., Ltd., Nishikasugai-Gun, Aichi-Ken (JP); NGK Insulators, Ltd., Nagoya-Shi, Aichi (JP); Osaka University, Suita-Shi, Osaka (JP)

( * ) Notice: Subject to any disclaimer, the term of this patent is extended or adjusted under 35 U.S.C. 154(b) by 573 days.

(21) Appl. No.: 12/448,207

(22) PCT Filed: Dec. 10, 2007

(86) PCT No.: PCT/JP2007/074180
§ 371 (c)(1),
(2), (4) Date: Aug. 5, 2009

(87) PCT Pub. No.: WO2008/072751
PCT Pub. Date: Jun. 19, 2008

(65) Prior Publication Data
US 2010/0093157 A1  Apr. 15, 2010

(30) Foreign Application Priority Data
Dec. 15, 2006  (JP) .................................. 2006-339056

(51) Int. Cl.
*H01L 21/20* (2006.01)

(52) U.S. Cl. .............................. 438/479; 438/46; 438/93

(58) Field of Classification Search .................... 438/46, 438/47, 93, 94, 479, 604
See application file for complete search history.

(56) References Cited

U.S. PATENT DOCUMENTS
6,229,151 B1  5/2001  Takeuchi et al.
(Continued)

FOREIGN PATENT DOCUMENTS
JP  11-112029  4/1999
(Continued)

OTHER PUBLICATIONS

Notification of the First Office Action dated Sep. 29, 2011, with English translation.
(Continued)

*Primary Examiner* — Kevin M Picardat
(74) *Attorney, Agent, or Firm* — McGinn IP Law Group, PLLC (57) ABSTRACT

A GaN single crystal 20 is grown on a crystal growth surface of a seed crystal (GaN layer 13) through the flux method in a nitrogen ($N_2$) atmosphere at 3.7 MPa and 870° C. employing a flux mixture including Ga, Na, and Li at about 870° C. Since the back surface of the template 10 is R-plane of the sapphire substrate 11, the template 10 is readily corroded or dissolved in the flux mixture from the back surface thereof. Therefore, the template 10 is gradually dissolved or corroded from the back surface thereof, resulting in separation from the semiconductor or dissolution in the flux. When the GaN single crystal 20 is grown to a sufficient thickness, for example, about 500 μm or more, the temperature of the crucible is maintained at 850° C. to 880° C., whereby the entirety of the sapphire substrate 11 is dissolved in the flux mixture.

20 Claims, 5 Drawing Sheets

U.S. PATENT DOCUMENTS 6,569,704 B1 * 5/2003 Takeuchi et al. ............ 438/94
7,071,494 B2 * 7/2006 Steigerwald et al. ........ 257/98
7,777,241 B2 * 8/2010 Moustakas et al. .......... 257/95

FOREIGN PATENT DOCUMENTS

| | | |
|---|---|---|
| JP | 2003-292400 | 10/2003 |
| JP | 2004-168650 | 6/2004 |
| JP | 2004-292286 | 10/2004 |
| JP | 2004-300024 | 10/2004 |
| JP | 2005-194146 | 7/2005 |
| JP | 2006-36561 | 2/2006 |

OTHER PUBLICATIONS

Yuji Yamada, et al., The growth of GaN single crystals on sapphire-free substrate, Journal of the Japanese Association of Crystal Growth, Aug. 25, 2004, vol. 31, No. 3, p. 106.

Form PCT/IB/326.

Form PCT/IB/373.

Form PCT/ISA/237.

* cited by examiner

METHOD FOR PRODUCING GROUP III NITRIDE-BASED COMPOUND SEMICONDUCTOR CRYSTAL

TECHNICAL FIELD

The present invention relates to a method for producing a Group III nitride-based semiconductor crystal through the flux method employing a sapphire substrate.

BACKGROUND ART

Hitherto, the flux method has been employed for producing a Group III nitride-based compound semiconductor crystal, and conventional production methods based on the flux method are disclosed in, for example, Patent Documents 1 to 5 described below.

A sapphire substrate, which is much less expensive than a GaN self-standing substrate, has significantly high industrial value. In conventional semiconductor production methods based on the flux method, particularly when a sapphire substrate is employed as a crystal growth substrate, the employed sapphire substrate has a C-plane main surface (hereinafter may be referred to as a C-plane substrate), as disclosed in, for example, Patent Document 1. Generally, as disclosed in, for example, Patent Document 2, a GaN layer serving as a seed crystal is formed on the main plane of the substrate through MOVPE or a similar technique, and the thus-coated sapphire C-plane substrate is employed as a crystal growth substrate.

Meanwhile, when the produced group III nitride-based compound semiconductor crystal is employed as a semiconductor substrate for fabricating optical devices, electronic devices, etc., the substrate preferably has a thickness of 400 µm or more so as to ensure sufficient strength and to allow easy and reliable handling.

Patent Document 1:
Japanese Patent Application Laid-Open (kokai) No. 2005-194146
Patent Document 2:
Japanese Patent Application Laid-Open (kokai) No. 2004-300024
Patent Document 3:
Japanese Patent Application Laid-Open (kokai) No. 2004-292286
Patent Document 4:
Japanese Patent Application Laid-Open (kokai) No. 2004-168650
Patent Document 5:
Japanese Patent Application Laid-Open (kokai) No. 2003-292400

DISCLOSURE OF THE INVENTION

Problems to be Solved by the Invention

When a sapphire substrate on which a seed crystal film such as a GaN layer has been formed (hereinafter referred to as a template) is employed as a crystal growth substrate, and a target Group III nitride compound semiconductor crystal is grown on the substrate to a large thickness, a large number of cracks are generated in the semiconductor crystal during removal of the semiconductor crystal from a reaction chamber, due to a great difference in thermal expansion coefficient between the semiconductor crystal and the sapphire substrate. Therefore, when the aforementioned template is employed as a base substrate (crystal growth substrate), difficulty is encountered in producing, for example, a semiconductor crystal of high quality having a thickness of, for example, 400 µm or more.

The present invention has been made in order to solve the aforementioned problem. Thus, an object of the invention is to produce a bulk semiconductor crystal of high quality in a simple manner and at low cost, through crystal growth based on the flux method.

Means for Solving the Problems

In order to solve the aforementioned problem, the following means are effective.

As a first means, the present invention provides a method for producing a semiconductor crystal in which a group III nitride-based compound semiconductor crystal is grown by reacting nitrogen (N) with a Group III element of gallium (Ga), aluminum (Al), or indium (In) in a flux mixture containing an alkali metal, which method comprises employing a sapphire substrate having a back surface that is not a uniform C-plane as a base substrate on which a Group III nitride-based compound semiconductor crystal is grown; and corroding, removing, melting, or dissolving at least a part of the sapphire substrate in the flux mixture during crystal growth of the Group III nitride-based compound semiconductor or after crystal growth of the Group III nitride-based compound semiconductor at a temperature in the vicinity of crystal growth temperature.

As used herein, the term "uniform C-plane" refers to a virtually flat surface (back surface), with almost the entire portion thereof assuming the C-plane. Generally, polishing scratches, cracks, some step-like unevenness, dislocations, etc. are formed on a surface of a sapphire substrate. However, even though the C-plane back surface of the sapphire substrate has such irregularities, with respect to the definition of uniform C-plane, the surface is still considered a virtually flat back surface in which almost the entire surface assumes the C-plane, provided that the C-axis is not intentionally caused to deviate from the normal direction of the back surface, and that curves, protrusions, dents, steps, grooves, holes, irregularities, etc. are not intentionally formed on the back surface of the sapphire substrate. Accordingly the present invention involves the case of that the C-plane back surface of the sapphire substrate has curves, protrusions, dents, steps, grooves, holes, irregularities, etc.

More preferably, the entirety of the sapphire substrate is corroded, removed, melted, or dissolved in the flux mixture. The aforementioned Group III nitride-based compound semiconductor includes any of 2-, 3-, and 4-component mixed-crystal semiconductors represented by formula "$Al_{1-x-y}Ga_y In_xN$ ($0 \leq x \leq 1, 0 \leq y \leq 1, 0 \leq 1-x-y \leq 1$). The Group III nitride-based compound semiconductor also encompasses such semiconductors to which a p-type or an n-type impurity has been added The angle between the normal of the back surface of the sapphire substrate and the C-axis of the sapphire substrate is preferably regulated to 10° to 90°, more preferably 20° to 90° (a second means). The angle ($\theta$) is defined as the smaller angle (acute angle) of the two types of angles formed by the intersection of the normal line and the C-axis.

The main plane of the sapphire substrate preferably assumes a small-Miller-index plane. As used herein, the term "small-Miller-index plane" refers to a plane having an absolute value of each component of a Miller index is 2 or less. For example, (1000) plane and (11-20) plane are small-Miller-index planes.

As a third means, the present invention provides a production method according to the second means, wherein the crystal growth surface of the sapphire substrate is formed of A-plane, R-plane, or M-plane.

As a fourth means, the present invention provides a production method according to any one of the first to third means, wherein the flux mixture comprises sodium (Na) with lithium (Li) or calcium (Ca).

In other words, at least one of lithium (Li) and calcium (Ca) is employed as a main component second to Na or as an additive of the employed flux mixture.

As a fifth means, the present invention provides a production method according to any one of the first to fourth means, wherein the base substrate is formed of a template including the sapphire substrate, an AlGaN buffer layer stacked on the crystal growth surface of the sapphire substrate, and a GaN layer stacked on the buffer layer.

Such a buffer layer and a GaN layer are generally stacked through a technique such as MOVPE. However, any film formation method may be employed in the present invention. Other techniques such as the flux method, HYPE, MBE, and sputtering are effectively employed for producing a seed crystal and a base substrate. Preferably, the buffer layer is grown at low temperature, and has a thickness of about 2 μm to about 4 μm. The buffer layer may have a multilayer structure or a complex layer structure.

As a sixth means, the present invention provides a production method according to any one of the first to fifth means, which method further includes, before crystal growth of the Group III nitride-based compound semiconductor, forming irregularities on the back surface of the sapphire substrate so as to increase the surface area of the back surface.

The irregularities may be formed mechanically or through chemical or physical etching. Alternatively, a thermal process by means of, for example, a laser may be employed for forming the irregularities.

As a seventh means, the present invention provides a production method according to any one of the first to sixth means, wherein the back surface of the sapphire substrate is caused to be in contact with the flux mixture during crystal growth of the Group III nitride-based compound semiconductor.

The contact between the back surface and the flux mixture is preferably performed to a satisfactory degree. More preferably, the flux melt (flux mixture) which comes into contact with the back surface of the sapphire substrate is appropriately circulated in accordance with needs through, for example, convection of the flux.

Therefore, for example, when thermal convection occurs in the flux, a base substrate (crystal growth substrate) having a sapphire substrate may be floated on the convection in the flux. In an alternative mode, the base substrate is placed in a space inside the heat- and pressure-resistant vessel and fixed, and the vessel is filled with a flux melt so that each surface of the base substrate is sufficiently in contact with the flux.

As an eighth means, the present invention provides a production method according to any one of the first to seventh means, wherein the Group III nitride-based compound semiconductor crystal is grown while the flux mixture and the Group III element is mixed and stirred.

No particular limitation is imposed on the stirring method, and any method may be employed. For example, a rocking-movement stirring apparatus as disclosed in Japanese Patent Application Laid-Open (kokai) No. 2006-041458 ("Group III element nitride crystal semiconductor device") may be employed. The rotation axis may be adjusted to any direction. For example, the rotation axis may be horizontal, vertical, or slanted.

In other words, the stirring/mixing process may be performed by any means for mechanically moving the reaction vessel through rocking, tumbling, rotating, etc. Alternatively, the stirring/mixing process may be performed by stirring the flux by means of, for example, a stirring rod or a stirring impeller (an impeller, see, for example, Japanese Patent Application Laid-Open (kokai) No. 2004-300024). Yet alternatively, heating means may be employed to generate a heat gradient in the flux, to thereby attain convection of the flux. These stirring methods may be employed in any combination.

As a ninth means, the present invention provides a production method according to any one of the first to eighth means, wherein a protective film is provided on the back surface of the base substrate, which protective film is corroded, removed, melted, or dissolved in the flux mixture during the crystal growth of a Group III nitride-based compound semiconductor.

The protective film is not necessarily formed uniformly on the entire back surface of the base substrate (sapphire substrate), and a coating failure may be intentionally ununiformly provided. Alternatively, the protective film may be formed with a predetermined pattern by means of, for example, a mask. Such a protective film may be formed from a material such as silicon (Si), silicon dioxide ($SiO_2$), aluminum nitride (AlN), or tantalum (Ta). The protective film may be formed through a known technique such as crystal growth, vacuum vapor deposition, or sputtering.

As a tenth means, the present invention provides a production method according to the ninth means, wherein the protective film contains an impurity which is to be added to a target Group III nitride-based compound semiconductor.

The protective film may be formed solely from such an impurity. Specifically, the material which can realize this mode includes silicon (Si).

According to the aforementioned means of the invention, the aforementioned problem can be effectively or rationally solved.

Effects of the Invention

The following preliminary experiment was carried out in order to confirm the effects of the present invention.
(Preliminary Experiment)

One sheet of each of an A-plane substrate, a C-plane substrate, and an R-plane substrate of sapphire (main plane area: about 170 $mm^2$, thickness: about 430 μm) were placed in a flux of the given composition. The flux was placed under nitrogen ($N_2$) gas for 120 hours under the following conditions. After this treatment, the mass of the sapphire substrates decreased. The results are shown in Table 1.
(1) Components of flux
  (a) Ga: 1,000 mg
  (b) Na: 880 mg
  (c) Li: 2 mg
(2) Temperature: 870° C.
(3) Nitrogen gas pressure: 3.7 MPa

TABLE 1

|  | A-plane substrate | C-plane substrate | R-plane substrate |
|---|---|---|---|
| θ | 90° | 0° | about 40° |
| Change in mass | −38% | −7% | −16% |

θ: Angle between the C-axis and the normal of each main plane

The experiment has revealed that the dissolution rate of each sapphire substrate in the flux mixture under high-temperature and high-pressure conditions monotonously increases as the angle θ (between the normal of the main plane of each sapphire substrate and the C-axis; $0° \leq θ \leq 90°$) increases.

Therefore, according to the first means of the present invention based on the effects, at least a part of the sapphire substrate is corroded, removed, melted, or dissolved in the flux mixture during crystal growth of a Group III nitride-based compound semiconductor or after crystal growth of a Group III nitride-based compound semiconductor at a temperature in the vicinity of crystal growth temperature. Thus, when the grown Group III nitride-based compound semiconductor crystal is cooled, application of stress from the sapphire substrate to the target semiconductor crystal is suppressed or eliminated. As a result, according to the first means of the present invention, a high-quality semiconductor crystal having a crack density remarkably lower than that conventionally attained can be produced.

Particularly when the entirety of the sapphire substrate is corroded, removed, melted, or dissolved, the grown semiconductor crystal is completely free from stress which would otherwise be caused by the sapphire substrate, whereby the crack density of the grown crystal is considerably reduced.

According to the second means of the present invention, the effects of the present invention can be more reliably attained.

According to the second means, the sapphire substrate can be readily removed within a short time. In addition, as disclosed in, for example, Japanese Patent Application Laid-Open (kokai) Nos. 11-112029 and 2006-36561, a piezoelectric field generated in the semiconductor crystal can be weakened. Thus, the second means of the present invention is more advantageous for the production of semiconductor devices such as optical devices.

According to the third means of the present invention, the employed base substrate can be readily formed. In addition, as disclosed in, for example, Japanese Patent Application Laid-Open (kokai) Nos. 11-112029 and 2006-36561, a piezoelectric field generated in the semiconductor crystal can be reduced to virtually the minimum value (about 0 MV/cm). Thus, the third means of the present invention is more advantageous for the production of semiconductor devices such as optical devices.

According to the fourth means of the present invention, when Li or Ca is added in a predetermined amount, the pressure of nitrogen gas required for crystal growth reaction may be reduced, or the crystal growth rate may be increased.

According to the fifth means of the present invention, the crystallinity of the seed crystal (GaN layer) can be enhanced by virtue of the stacked buffer layer on which the seed crystal is stacked. Therefore, a semiconductor crystal of improved quality can be produced. That is, as compared with the case where a GaN layer is formed directly on the crystal growth surface of the sapphire substrate, the produced semiconductor crystal has less cracks and higher crystallinity.

According to the sixth means of the present invention, the surface area of the back surface of the sapphire substrate increases, whereby the dissolution rate of the sapphire substrate increases. Particularly when the aforementioned angle θ is small, surfaces of irregularities provided at the back surface partially assume A-plane, M-plane, or R-plane. Thus, particularly in an early stage of dissolution of the sapphire substrate, the dissolution rate may be increased to a level higher than that attained by the dissolution enhance effect in proportion to the increase in surface area of the back surface of the sapphire substrate.

According to the seventh means of the present invention, the flux melt comes into contact with the back surface of the sapphire substrate, or is circulated and refreshed over time at the contact portion, whereby the dissolution rate of the sapphire substrate can be enhanced.

According to the eighth means of the present invention, the flux melt is vigorously and sufficiently stirred, whereby the melting rate of the sapphire substrate can be further enhanced.

According to the ninth means of the invention, the rate and timing of dissolution of the sapphire substrate in the flux can be suitably controlled through selection of the material, thickness, pattern, etc. of the protective film. Therefore, according to the ninth means of the invention, dissolution of the sapphire substrate can be initiated after the growth of a semiconductor crystal of interest in a predetermined thickness of more on the seed crystal; i.e., after the attainment of consistent crystal growth. In addition, according to the ninth means of the invention, the timing of dissolution of the sapphire substrate can be retarded through increasing the thickness of the protective film, whereby migration of molten sapphire ($Al_2O_3$) to a semiconductor crystal of interest and doping of the semiconductor with a component of sapphire can be prevented.

According to the tenth means of the present invention, the phenomenon of dissolution of the protective film in the flux can be employed as addition of an impurity element. That is, an additional impurity-adding step is not required. In addition, the amount of the required impurity material can be reduced. Therefore, in this case, the protective film may be formed of a material such as silicon (Si) or silicon oxide ($SiO_2$).

BRIEF DESCRIPTION OF THE DRAWINGS

FIG. 2-A shows the configuration of a crystal growth apparatus employed in Embodiment 1.

FIG. 2-B is a cross-section of a part of the configuration of a crystal growth apparatus employed in Embodiment 1.

FIG. 3-A is a cross-section of a semiconductor structure showing a semiconductor crystal growth step in Embodiment 1.

FIG. 3-B is a cross-section of a semiconductor structure showing a semiconductor crystal growth step in Embodiment 1.

FIG. 3-C is a cross-section of a semiconductor structure showing a semiconductor crystal growth step in Embodiment 1.

DESCRIPTION OF REFERENCE NUMERALS

9: Flux mixture
10: Template
11: Sapphire substrate (R-plane substrate)
20: Semiconductor substrate (Group III nitride-based compound semiconductor crystal)
24: Stainless steel vessel (reaction chamber)
25: Electric furnace
H: Heater

BEST MODES FOR CARRYING OUT THE INVENTION

Reaction between the Group III element and nitrogen is performed more preferably at 500° C. to 1,100° C. and at a nitrogen-containing gas pressure of 0.1 MPa to 6 MPa. Use of ammonia gas ($NH_3$) may lower the pressure of the atmosphere. The nitrogen gas employed may be in a plasma state.

To a target Group III nitride-based compound semiconductor crystal, an impurity may be added. Examples of the impurity which may be added to the flux mixture include boron (B), thallium (Tl), calcium (Ca) or compounds containing calcium (Ca), silicon (Si), sulfur (S), selenium (Se), tellurium (Te), carbon (C), oxygen (O), aluminum (Al), indium (In), alumina ($Al_2O_3$), indium nitride (InN), silicon nitride ($Si_3N_4$), silicon oxide ($SiO_2$), indium oxide ($In_2O_3$), zinc (Zn), magnesium (Mg), strontium (Sr), barium (Ba), zinc oxide (ZnO), magnesium oxide (MgO), and germanium (Ge). These impurities may be used singly or in combination of two or more species. That is, these impurities may be used in any combination. Through addition of these impurities, physical properties of a target semiconductor crystal such as bandgap, electrical conductivity, and lattice constant can be tuned to desired values.

In order to mitigate or prevent melting of a seed crystal (a Group III nitride-based compound semiconductor crystal), which is included in the base substrate, in the flux before initiation of the target crystal growth through the flux method, a nitride such as $Ca_3N_2$, $Li_3N$, $NaN_3$, BN, $Si_3N_4$, or InN may be incorporated into the flux in advance. By virtue of the presence of these nitrides in the flux, the nitrogen content of the flux increases, whereby melting of the seed crystal in the flux before initiation of the target crystal growth can be successfully prevented or mitigated.

No particular limitation is imposed on the crystal growth apparatus employed in the invention, and any apparatus may be employed, so long as the flux method can be carried out by means of the apparatus. For example, a growth apparatus disclosed in the aforementioned Patent Documents may be employed. The temperature of a reaction chamber of the crystal growth apparatus for the growth based on the flux method is preferably controllable to about 1,000° C. The pressure of the reaction chamber is preferably controllable to about 100 atm (about $1.0 \times 10^7$ Pa). The elements of the crystal growth apparatus including an electric furnace, a stainless steel vessel (reaction vessel), a raw material gas tank, and piping, are preferably formed of a material such as stainless steel (SUS) material, an alumina material, or copper.

The aforementioned protective film may be formed into any pattern through a known patterning technique such as photolithography or etching. Dissolution of the sapphire substrate can be performed earlier as the thickness of the protective film is smaller, and the dissolution rate is increased with increasing surface area of the sapphire substrate exposed to the flux. In other words, through controlling these conditions, dissolution of the sapphire substrate initiates when the surface of the sapphire substrate has come into contact with the high-temperature flux, and the dissolution rate increases generally in proportion to the surface area of the substrate exposed to the flux at a given angle θ. Thus, through appropriate control of these conditions of the protective film and the angle θ, the sapphire substrate dissolution initiating time, time for dissolving the substrate, sapphire substrate dissolution rate, etc. can be adjusted as desired. The time for dissolving the sapphire substrate may also be adjusted as desired through control of the thickness of the substrate, the temperature of the flux, etc.

No specific limitations are imposed on the dimensions and the thickness of the seed crystal and the base substrate. However, in consideration of industrial utility in practice, shapes such as a circle (diameter of about 45 mm) and squares (e.g., about 27 mm×27 mm and about 13 mm×13 mm) are more preferred. The radius of curvature of the crystal growth surface of the seed crystal or the base substrate is preferably large.

Specific embodiments of the present invention will next be described.

However, these embodiments should not be construed as limiting the invention thereto.

Embodiment 1

Steps included in Embodiment 1 of crystal growth based on the flux method will next be described.

1. Production of a Base Substrate

Figure 1:
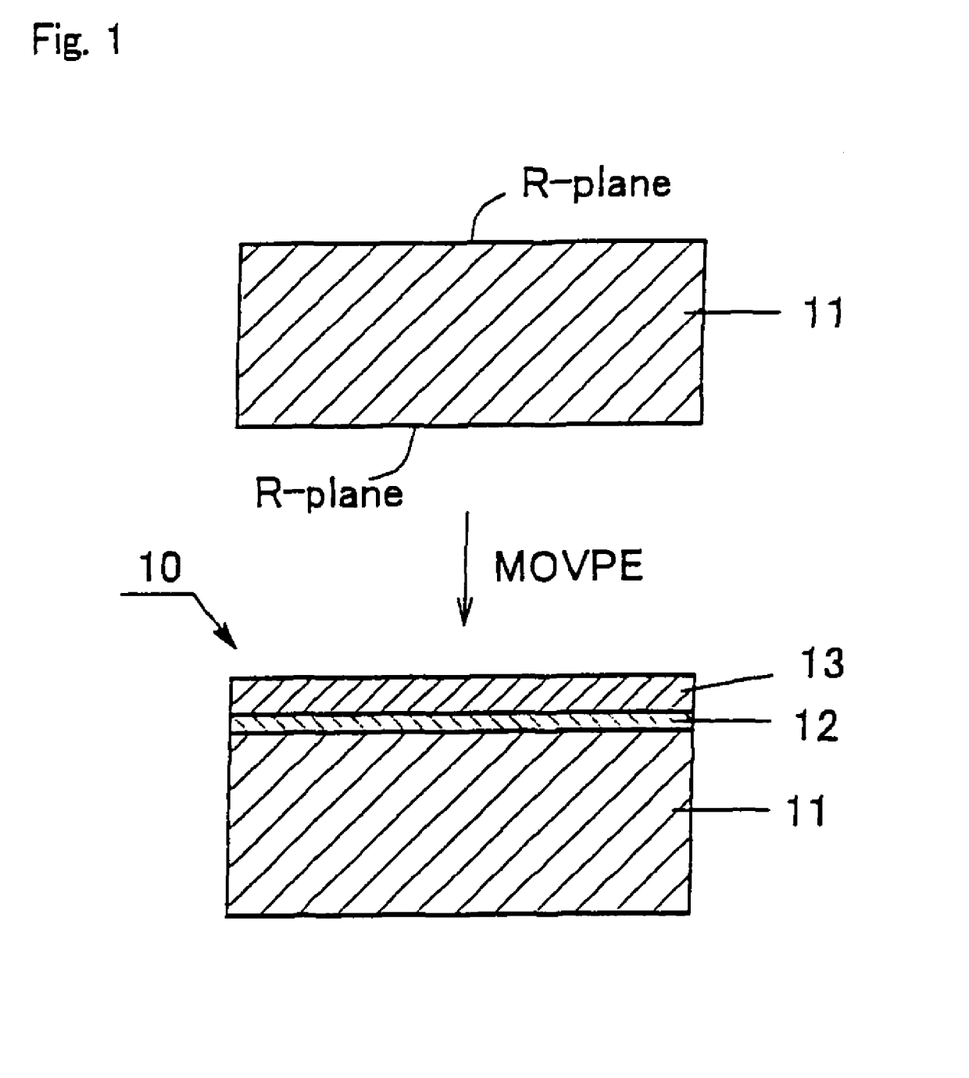
FIG. 1 shows cross-sections of a semiconductor structure showing steps of producing a template 10 employed in Embodiment 1.

FIG. 1 shows cross-sections showing steps of forming a base substrate (template 10) employed in Embodiment 1. In this step, an AlGaN buffer layer 12 (about 4 μm) is grown, through MOVPE, on a sapphire substrate 11 (about 13 mm× about 13 mm× about 450 μm (thickness)) having a main plane assuming R-plane. Subsequently, a GaN layer 13 is stacked on the buffer layer. The GaN layer 13 may be dissolved in a flux to some extent by the time of initiation of growth of a target semiconductor crystal based on the flux method. Therefore, the GaN layer 13 is formed to have such a thickness that it is not completely dissolved in the flux until crystal growth is initiated.

In order to mitigate or prevent such dissolution of a seed crystal, a nitride such as $Ca_3N_2$, $Li_3N$, $NaN_3$, BN, $Si_3N_4$, or InN may be incorporated into the flux in advance; for example, before the crystal growth process as described hereinbelow.

2. Configuration of Crystal Growth Apparatus

Figure 2:
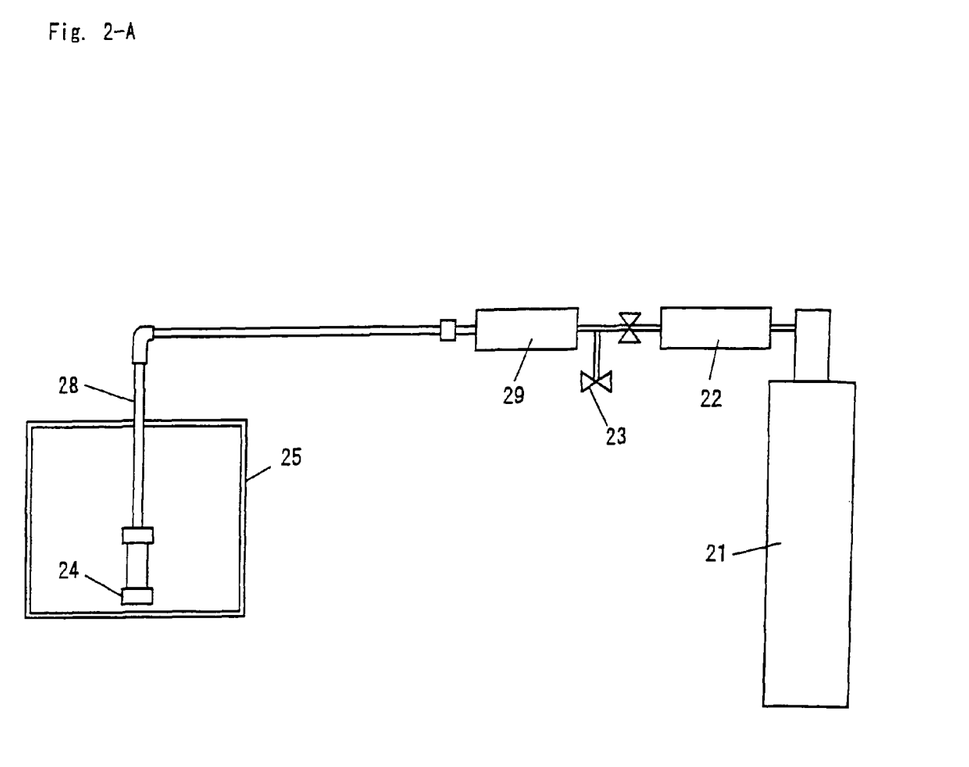

FIGS. 2-A and 2-B show the configuration of a crystal growth apparatus employed in Embodiment 1. The crystal growth apparatus, for performing a crystal growth process based on the flux method, includes a raw material gas tank 21 for supplying nitrogen gas; a pressure regulator 22 for regulating the pressure of a crystal growth atmosphere; a leakage valve 23; and an electric furnace 25 for performing crystal growth. The electric furnace 25, the piping for connecting the raw material gas tank 21 to the electric furnace 25, etc. are formed of, for example, a stainless steel (SUS) material, an alumina material, or copper.

The electric furnace 25 includes a stainless steel vessel 24 (reaction chamber) therein, and the stainless steel vessel 24 includes a crucible 26 (reaction vessel) therein. The crucible 26 may be formed of, for example, boron nitride (BN) or alumina ($Al_2O_3$).

The temperature of the interior of the electric furnace 25 may be raised or lowered as desired, so long as the temperature does not exceed 1,000° C. The pressure of the crystal growth atmosphere in the stainless steel vessel 24 may be increased or decreased as desired by means of the pressure regulator 22 or a pressure regulator 29, the leakage valve 23, etc. via the piping 28, so long as the pressure does not exceed $1.0 \times 10^7$ Pa.

FIG. 2-B is a cross-section of the stainless steel vessel 24. The reaction chamber has a cylindrical sidewall 27, and a heater H in ring form for heating the chamber is provided at the foot of the outer surface of the chamber. The heater H is provided for heating the crucible 26 (reaction vessel) via the bottom of the reaction chamber, and generates thermal convection in a flux mixture 9 placed in the crucible 26. Through the thus-generated thermal convection, the rate of growing a target semiconductor crystal can be enhanced, along with the dissolution rate of the sapphire substrate in the flux.

3. Crystal Growth Step

Next will be described, with reference to FIGS. 3-A to 3-C, the crystal growth step of Embodiment 1 employing the crystal growth apparatus shown in FIGS. 2-A and 2-B.

(1) Firstly, sodium (Na) (10.5 g), gallium (Ga) (12.2 g), and lithium (Li) (24.4 mg) are placed in the reaction vessel (crucible 26), and the reaction vessel (crucible 26) is placed in the reaction chamber (stainless steel vessel 24) of the crystal growth apparatus, followed by evacuation of the gas contained in the reaction chamber.

When such an operation is performed in air, Na is immediately oxidized. Therefore, setting of the substrate or the raw materials in the reaction vessel is carried out in a glove box filled with an inert gas (e.g., Ar gas). If necessary, any of the aforementioned additives (e.g., an alkaline earth metal) may be added to the crucible in advance.

(2) Subsequently, while the temperature of the crucible is regulated to about 880° C., nitrogen gas ($N_2$) is fed into the reaction chamber of the crystal growth apparatus, whereby the nitrogen gas ($N_2$) pressure in the reaction chamber is maintained at about 3.7 MPa. In this case, the sapphire substrate 11 forming the template 10 is immersed in a flux melt (flux mixture) formed through the temperature elevation, and the crystal growth surface of the template 10 (i.e., the exposed surface of the GaN layer 13) is located in the vicinity of the interface between the melt and the nitrogen gas.

In other words, the crystal growth surface is preferably immersed in the flux mixture continuously during the above step. Also preferably, the flux melt is stirred well by means of, for example, the aforementioned heater H, whereby the nitrogen gas component ($N_2$ or N) in the atmosphere is sufficiently and continuously incorporated into the flux. Moreover, if stirring is performed satisfactorily, the template 10 may be placed at the bottom of the crucible 26.

(3) Thereafter, thermal convection is generated in the flux mixture 9 by means of the heater H (FIG. 2-B), whereby the flux mixture 9 is stirred, and the crystal growth conditions as described in (2) above are maintained for about 100 hours.

Under the above-described conditions, the atoms constituting the material for producing a Group III nitride compound semiconductor are continuously in a supersaturated state in the vicinity of the interface between the Ga—Na melt and nitrogen gas. Therefore, a target semiconductor crystal (GaN single crystal 20) can be successfully grown on the crystal growth surface of the template 10 (FIG. 1), as shown in FIG. 3-A. Since the back surface of the template 10 assumes R-plane of the sapphire substrate 11, the template 10 is readily dissolved or corroded in the flux mixture 9 from the back surface thereof. Therefore, as shown in FIG. 3-B, the template 10 is gradually dissolved or corroded from the back surface thereof, resulting in separation from the semiconductor or dissolution in the flux.

4. Dissolution of Crystal Growth Substrate

Figure 3:
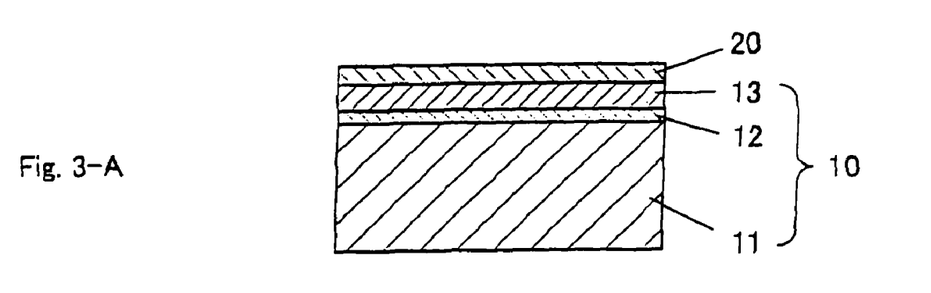

After the GaN single crystal 20 is grown to have a sufficient thickness (e.g., about 500 µm or more) through the above-described crystal growth step, the temperature of the crucible is continued to be maintained at 850° C. to 880° C. until the sapphire substrate 11 is completely dissolved in the flux (FIGS. 3-B and 3-C). Thereafter, while the pressure of the nitrogen gas ($N_2$) is maintained at 10 to 50 atm (about $1 \times 10^6$ to about $5 \times 10^6$ Pa), the temperature of the reaction chamber is lowered to 100° C. or less. The reason for controlling the dissolution temperature lower than the growth temperature is to prevent re-melting the grown crystal. However, when the dissolution temperature is lowered excessively, the dissolution rate of the sapphire substrate is reduced, which is not preferred.

Other layers such as the buffer layer 12 are preferably dissolved in the flux mixture. The step of dissolving the sapphire substrate 11 in the flux and the above temperature lowering step may be carried out somewhat in parallel. The mode of parallel/simultaneous progress of these steps can be appropriately regulated according to any of the sixth to ninth means of the invention.

5. Removal of Flux

Subsequently, the above-grown GaN single crystal 20 (target semiconductor crystal) is removed from the reaction chamber of the crystal growth apparatus, and the single crystal is cooled to 30° C. or lower. Thereafter, while the temperature of the atmosphere surrounding the GaN single crystal 20 is also maintained at 30° C. or lower, the flux (Na) deposited on the periphery of the single crystal is removed by use of ethanol.

When the above-described steps are carried out sequentially, there can be produced at low cost, a high-quality semiconductor single crystal (GaN single crystal 20) which has almost the same surface area as that of the sapphire substrate 11 as shown in FIG. 1 and a thickness of 500 µm or more and has considerably reduced cracks as compared with conventional semiconductor single crystals.

Embodiment 2

Figure 4:
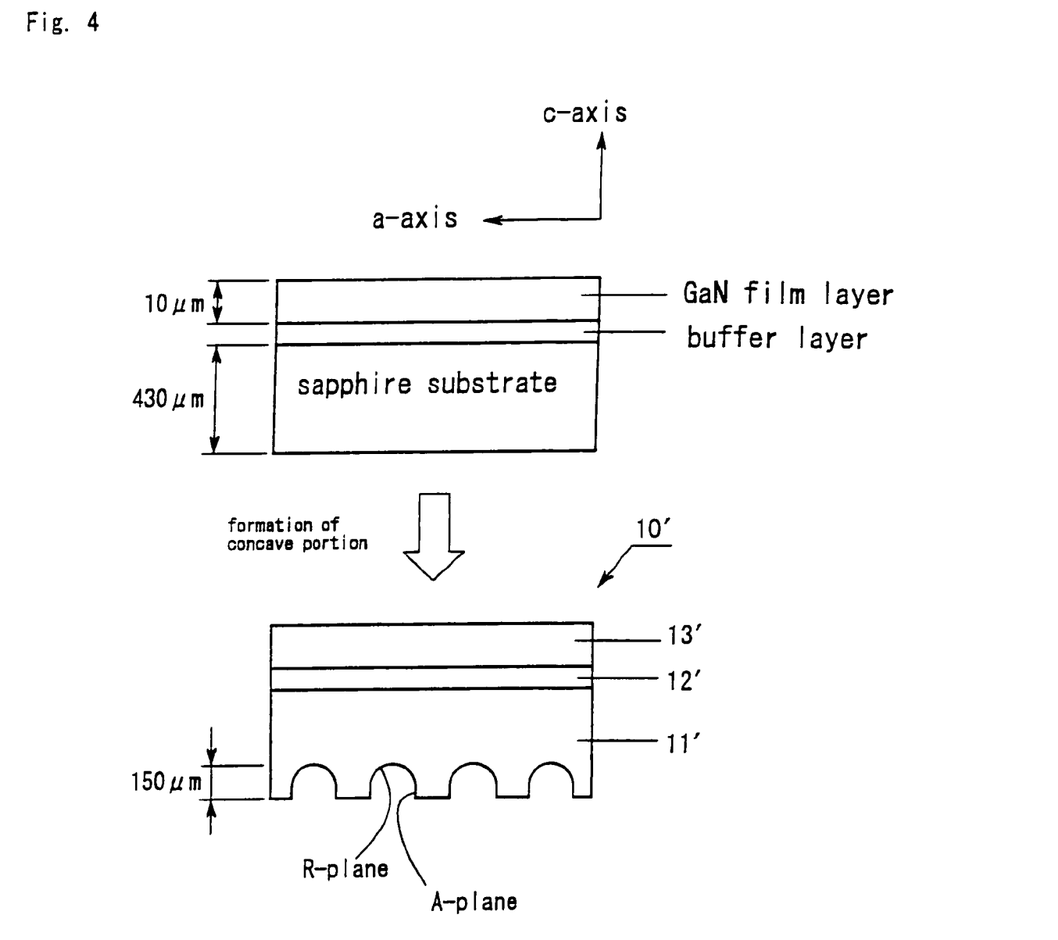
FIG. 4 shows cross-sections of a semiconductor structure showing steps of producing a template 10' employed in Embodiment 2.

FIG. 4 is a cross-section showing a step of producing a template 10' of Embodiment 2. Since the template 10' can be formed in a manner almost similar to that employed for producing the template 10 of Embodiment 1, elements corresponding to those of the template 10 are denoted by the same reference numeral with the prime '. The sapphire substrate 11' employed in Embodiment 2 has a top surface (crystal growth surface) and a back surface both assuming plane. A large number of grooves (dents) are formed in the back surface so that a large area of the back surface assumes R-plane or A-plane. As shown in FIG. 4, the grooves have a depth of about 150 µm.

In a manner similar to that employed in Embodiment 1, crystal growth is performed by use of the template 10'. Specifically, the template 10' is maintained in a flux mixture at 880° C. for 150 hours, and a GaN single crystal (thickness: about 1.5 mm) is grown on a GaN thin film 13' through the flux method. Subsequently, the flux mixture is cooled to 850° C., and the template 10' is further maintained for 50 hours in the flux mixture, whereby a part of the sapphire substrate 11' is dissolved from the back surface thereof.

As a result, the thickness of the sapphire substrate 11' can be reduced to about half the initial thickness. Thereafter, the remaining sapphire substrate 11' is cracked to tiny fragments during cooling to ambient temperature, and the fragments are separated from the GaN single crystal. The fragmentation is conceived to occur for the reason that stress attributable to the difference in thermal expansion coefficient is effectively applied to the remaining sapphire substrate 11' which has been thinned by the aforementioned dissolution process. No cracks are observed in the grown GaN single crystal, possibly because the GaN single crystal has a sufficient thickness.

Other Modifications

The present invention is not limited to the above-described embodiments, and the below-exemplified modifications may be made. Effects of the present invention can also be obtained through such modifications or applications according to the operation of the present invention.

Modification 1

In Embodiment 1, lithium (Li) is added to the flux mixture in the crystal growth. However, instead of lithium (Li), calcium (Ca) may also be used. Alternatively, in addition to lithium (Li), calcium (Ca) may be added.

The nitrogen (N)-containing gas, which serves as a source of the crystal, may be nitrogen gas ($N_2$), ammonia gas ($NH_3$), or a mixture thereof. The nitrogen (N) may be in a plasma state.

In the aforementioned compositional formula of the Group III nitride-based compound semiconductor forming the target semiconductor crystal, the Group III element (Al, Ga, or In) atoms may be at least partially substituted by atoms of an element such as boron (B) or thallium (Tl), or nitrogen (N) atoms may be at least partially substituted by atoms of an element such as phosphorus (P), arsenic (As), antimony (Sb), or bismuth (Bi).

Examples of the p-type impurities (acceptors) which may be used in the invention include alkaline earth metals such as magnesium (Mg) and calcium (Ca). Examples of the n-type impurities (donors) which may be used in the invention include silicon (Si), sulfur (S), selenium (Se), tellurium (Te), and germanium (Ge). These impurities (acceptors or donors) may be added in two or more species in a single operation, or two types of impurities (p- and n-types) may be added simultaneously. Briefly, these impurities may be added to a target semiconductor crystal through, for example, preliminarily melting thereof in a flux.

(Modification 2)

A protective film may be formed on the back surface of the sapphire substrate. The protective film may be an AlN layer formed on the back surface through, for example, MOVPE, or a film of a material such as silicon (Si), silicon oxide ($SiO_2$), or tantalum (Ta) formed by means of a sputtering apparatus or a vacuum vapor deposition apparatus. The thus-formed protective film can retard the timing of initiation of corrosion, dissolution, or the like of the sapphire substrate. The sapphire substrate is formed of $Al_2O_3$. Therefore, in the case where incorporation of aluminum or oxygen into a target semiconductor crystal is undesired, such a protective film may be effective based on the retardation effect.

Alternatively, the material constituting the protective film may be employed as an impurity to be added to a semiconductor crystal.

(Modification 3)

In Embodiment 1, the main plane of R-plane is employed. However, an A-plane substrate (i.e., a sapphire substrate having a main plane of sapphire A-plane), an M-plane substrate, or other substrates may also be employed. Through employment of these crystal planes as the main plane of the sapphire substrate, a piezoelectric field generated in the produced semiconductor crystal can be reduced to virtually the minimum value (about 0 MV/cm).

A GaN layer may be formed directly on the main plane of an R-plane substrate, an A-plane substrate, an M-plane substrate, or the like.

(Modification 4)

When a sapphire R-plane substrate is employed, irregularities such as V-shape grooves may be formed in the back surface of the substrate. In such a case, the surfaces of the grooves assume A-plane at least in the form of very fine steps. Mote specifically, since the back surface has an increased surface area and partially assumes A-plane, and has been grooved, the dissolution time of the sapphire substrate is shortened. Thus, this approach simplifies the semiconductor production steps.

(Modification 5)

In the crystal growth performed in Embodiment 1, lithium (Li) has been added in advance to a flux mixture. However, an additive such as lithium or calcium may also be added after completion of the crystal growth step. Through this addition, the dissolution rate of the sapphire substrate can also be enhanced.

INDUSTRIAL APPLICABILITY

The present invention is effectively applicable to, for example, production of semiconductor devices employing a Group III nitride-based compound semiconductor crystal. The semiconductor devices which can be produced according to the invention include light-emitting devices and photoreceptors such as LEDs and LDs as well as semiconductor devices of general use such as FETs.

The invention claimed is:

1. A method for producing a semiconductor crystal in which a Group III nitride-based compound semiconductor crystal is grown by reacting nitrogen (N) with a Group III element of gallium (Ga), aluminum (Al), or indium (In) in a flux mixture containing an alkali metal, the method comprising:
    employing a sapphire substrate having a back surface that is not a uniform C-plane as a base substrate on which a Group III nitride-based compound semiconductor crystal is grown; and
    corroding, removing, melting, or dissolving at least a part of the sapphire substrate in the flux mixture during crystal growth of the Group III nitride-based compound semiconductor or after crystal growth of the Group III nitride-based compound semiconductor at a temperature in the vicinity of crystal growth temperature.

2. A method for producing a Group III nitride-based compound semiconductor crystal as described in claim 1, wherein the angle between the normal of the back surface of the sapphire substrate and the C-axis of the sapphire substrate is 10° to 90°.

3. A method for producing a Group III nitride-based compound semiconductor crystal as described in claim 2, wherein the sapphire substrate has a crystal growth surface formed of A-plane, R-plane, or M-plane.

4. A method for producing a Group III nitride-based compound semiconductor crystal as described in claim 1, wherein the flux mixture comprises sodium (Na) with lithium (Li) or calcium (Ca).

5. A method for producing a Group III nitride-based compound semiconductor crystal as described in claim 1, wherein the base substrate is formed of a template including the sapphire substrate, an AlGaN buffer layer stacked on the crystal growth surface of the sapphire substrate, and a GaN layer stacked on the buffer layer.

6. A method for producing a Group III nitride-based compound semiconductor crystal as described in claim 1, which method further includes, before crystal growth of the Group III nitride-based compound semiconductor, forming irregularities on the back surface of the sapphire substrate so as to increase the surface area of the back surface.

7. A method for producing a Group III nitride-based compound semiconductor crystal as described in claim 1, wherein the back surface of the sapphire substrate is caused to be in contact with the flux mixture during crystal growth of the Group III nitride-based compound semiconductor.

8. A method for producing a Group III nitride-based compound semiconductor crystal as described in claim 1, wherein the Group III nitride-based compound semiconductor crystal is grown while the flux mixture and the Group III element is mixed and stirred.

9. A method for producing a Group III nitride-based compound semiconductor crystal as described in claim 1, wherein a protective film is provided on the back surface of the base substrate, which protective film is corroded, removed, melted, or dissolved in the flux mixture during the crystal growth of a Group III nitride-based compound semiconductor.

10. A method for producing a Group III nitride-based compound semiconductor crystal as described in claim 9, wherein the protective film contains an impurity which is to be added to the Group III nitride-based compound semiconductor.

11. A method for producing a Group III nitride-based compound semiconductor crystal as described in claim 2, wherein the flux mixture comprises sodium (Na) with lithium (Li) or calcium (Ca).

12. A method for producing a Group III nitride-based compound semiconductor crystal as described in claim 3, wherein the flux mixture comprises sodium (Na) with lithium (Li) or calcium (Ca).

13. A method for producing a Group III nitride-based compound semiconductor crystal as described in claim 2, wherein the base substrate is formed of a template including the sapphire substrate, an AlGaN buffer layer stacked on the crystal growth surface of the sapphire substrate, and a GaN layer stacked on the buffer layer.

14. A method for producing a Group III nitride-based compound semiconductor crystal as described in claim 3, wherein the base substrate is formed of a template including the sapphire substrate, an AlGaN buffer layer stacked on the crystal growth surface of the sapphire substrate, and a GaN layer stacked on the buffer layer.

15. A method for producing a Group III nitride-based compound semiconductor crystal as described in claim 4, wherein the base substrate is formed of a template including the sapphire substrate, an AlGaN buffer layer stacked on the crystal growth surface of the sapphire substrate, and a GaN layer stacked on the buffer layer.

16. A method for producing a Group III nitride-based compound semiconductor crystal as described in claim 2, which method further includes, before crystal growth of the Group III nitride-based compound semiconductor, forming irregularities on the back surface of the sapphire substrate so as to increase the surface area of the back surface.

17. A method for producing a Group III nitride-based compound semiconductor crystal as described in claim 3, which method further includes, before crystal growth of the Group III nitride-based compound semiconductor, forming irregularities on the back surface of the sapphire substrate so as to increase the surface area of the back surface.

18. A method for producing a Group III nitride-based compound semiconductor crystal as described in claim 4, which method further includes, before crystal growth of the Group III nitride-based compound semiconductor, forming irregularities on the back surface of the sapphire substrate so as to increase the surface area of the back surface.

19. A method for producing a Group III nitride-based compound semiconductor crystal as described in claim 5, which method further includes, before crystal growth of the Group III nitride-based compound semiconductor, forming irregularities on the back surface of the sapphire substrate so as to increase the surface area of the back surface.

20. A method for producing a Group III nitride-based compound semiconductor crystal as described in claim 2, wherein the back surface of the sapphire substrate is caused to be in contact with the flux mixture during crystal growth of the Group III nitride-based compound semiconductor.

\* \* \* \* \*